US009300337B2

(12) United States Patent
Tasic et al.

(10) Patent No.: US 9,300,337 B2
(45) Date of Patent: Mar. 29, 2016

(54) RECONFIGURABLE CARRIER-AGGREGATION RECEIVER AND FILTER

(71) Applicant: QUALCOMM Incorporated, San Diego, CA (US)

(72) Inventors: Aleksandar Miodrag Tasic, San Diego, CA (US); Klaas van Zalinge, La Jolla, CA (US); Gurkanwal Singh Sahota, San Diego, CA (US); Jeremy Darren Dunworth, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 144 days.

(21) Appl. No.: 14/136,893

(22) Filed: Dec. 20, 2013

(65) Prior Publication Data
US 2015/0180523 A1    Jun. 25, 2015

(51) Int. Cl.
*H04B 1/26*    (2006.01)
*H04B 1/00*    (2006.01)
(Continued)

(52) U.S. Cl.
CPC .............. *H04B 1/26* (2013.01); *H03H 7/0161* (2013.01); *H03H 19/008* (2013.01); *H04B 1/006* (2013.01); *H04B 1/0057* (2013.01)

(58) Field of Classification Search
CPC . H03H 7/0115; H03H 7/0138; H03H 7/0153; H03H 7/0161; H03H 7/0169; H03H 7/09; H03H 7/12; H03H 7/19; H03H 7/20; H03H 7/21; H03H 7/427; H03H 11/1204; H03H 11/1291; H03H 11/1295; H03H 19/00; H03H 19/002; H03H 19/004; H03H 19/006; H03H 19/008; H03H 2007/013; H03H 2007/0192; H04B 1/005; H04B 1/0057; H04B 1/006; H04B 1/0071; H04B 1/0075; H04B 1/0078; H04B 1/0082; H04B 1/0089; H04B 1/12; H04B 1/123; H04B 1/16; H04B 1/1607; H04B 1/1615; H04B 1/26; H04B 1/38; H04B 1/40; H04B 1/401; H04B 1/44
USPC ......... 375/219, 220, 223, 232, 235, 297, 298, 375/308, 326–332, 349–351; 329/304, 329/306–310; 455/73, 75, 76, 78, 83, 86, 455/88, 160.1, 189.1, 191.1, 191.3, 193.2, 455/197.2, 197.3, 209, 210, 213, 225, 455/253.2, 260, 265, 307, 311, 339, 340; 708/300, 316, 319, 322, 323
See application file for complete search history.

(56) References Cited

U.S. PATENT DOCUMENTS 6,148,048 A     11/2000  Kerth et al.
6,417,737 B1 *   7/2002  Moloudi et al. .............. 330/301
(Continued)

FOREIGN PATENT DOCUMENTS

WO         0128310 A2    4/2001
WO      2011071944       6/2011

OTHER PUBLICATIONS

International Search Report and Written Opinion—PCT/US2014/071086—ISA/EPO—Apr. 8, 2015.

*Primary Examiner* — Young Tse
(74) *Attorney, Agent, or Firm* — Smith Risley Tempel Santos LLC

(57) ABSTRACT

A device includes, a reconfigurable baseband filter configured to receive a communication signal having a first carrier and a second carrier, the first carrier and the second carrier having non-contiguous respective frequencies, the reconfigurable baseband filter having a first filter portion and a second filter portion, the first filter portion and the second filter portion each comprising respective first and second amplification stages, and a plurality of switches associated with the first filter portion and the second filter portion, the plurality of switches for configuring the reconfigurable baseband filter into a plurality of sub-filters, each configured to generate at least one of a low pass filter output and a bandpass filter output.

18 Claims, 9 Drawing Sheets

(51) Int. Cl.
*H03H 19/00* (2006.01)
*H03H 7/01* (2006.01)

(56) References Cited

U.S. PATENT DOCUMENTS

| | | | |
|---|---|---|---|
| 6,735,416 B1 | 5/2004 | Marko et al. | |
| 6,975,840 B2 | 12/2005 | Lin | |
| 7,529,322 B2 | 5/2009 | Mak et al. | |
| 8,442,473 B1 | 5/2013 | Kaukovuori et al. | |
| 2004/0209591 A1 | 10/2004 | Martin et al. | |
| 2006/0128342 A1* | 6/2006 | Marholev | 455/307 |
| 2012/0046004 A1 | 2/2012 | Mirzaei et al. | |
| 2012/0194265 A1* | 8/2012 | Katsube et al. | 327/554 |
| 2014/0065992 A1* | 3/2014 | Lee et al. | 455/139 |
| 2014/0155014 A1* | 6/2014 | Leung et al. | 455/318 |
| 2015/0084688 A1* | 3/2015 | Chang et al. | 327/555 |

\* cited by examiner

US 9,300,337 B2

RECONFIGURABLE CARRIER-AGGREGATION RECEIVER AND FILTER

BACKGROUND

1. Field

The present disclosure relates generally to electronics, and more specifically to transmitters and receivers.

2. Background

In a radio frequency (RF) transceiver, a communication signal is typically received and downconverted by receive circuitry, sometimes referred to as a receive chain. A receive chain typically includes a receive filter, a low noise amplifier (LNA), a mixer, a local oscillator (LO), a voltage controlled oscillator (VCO), a baseband filter, and other components, to recover the information contained in the communication signal. The transceiver also includes circuitry that enables the transmission of a communication signal to a receiver in another transceiver. The transceiver may be able to operate over multiple frequency ranges, typically referred to a frequency bands. Moreover, a single transceiver may be configured to operate using multiple carrier signals that may occur in the same frequency band, but that may not overlap in actual frequency, an arrangement referred to as non-contiguous carriers.

In some instances, it is desirable to have a single transmitter or receiver that is configured to operate using multiple transmit frequencies and/or multiple receive frequencies. For a receiver to be able to simultaneously receive two or more receive signals, the concurrent operation of two or more receive paths is required. Such systems are sometimes referred to as "carrier-aggregation" systems. The term "carrier-aggregation" may refer to systems that include inter-band carrier aggregation and intra-band carrier aggregation. Intra-band carrier aggregation refers to the processing of two separate and non-contiguous carrier signals that occur in the same communication band. Currently, even though these non-contiguous carriers may be close together, a separate receive chain is typically needed to process each carrier. Unfortunately, using a separate receive chain to process the non-contiguous carriers is power intensive and consumes valuable space on the medium on which the receiver is fabricated.

Therefore, it would be desirable to have a way to downconvert multiple non-contiguous carriers that overcomes the above-mentioned limitations.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used herein, the terms "interfering signal," "jammer," "jammer signal," and "TX jammer" are used to describe a signal present at a receiver that can degrade the receiver's performance in detecting and downconverting a desired receive signal.

Exemplary embodiments of the disclosure are directed toward a reconfigurable carrier-aggregation receiver and filter that allows downconverting non-contiguous carriers in an intra-band carrier aggregation mode with a single local oscillator (LO) path, single voltage controlled oscillator (VCO), and singe phase locked loop (PLL), thereby reducing complexity and reducing current consumption of the receiver in an intra-band carrier aggregation mode. When the LO frequency is located substantially halfway between the two non-contiguous carriers, a single LO/VCO/PLL path can be used to downconvert two non-contiguous carriers.

Using complex signal processing at the baseband, both carriers (one at positive frequency (above LO frequency before downconversion) and one at negative frequency (below LO frequency before downconversion) are filtered to extract the respective baseband information signal prior to analog-to-digital conversion. Spurious performance improves by eliminating one LO/VCO/PLL path for intra-band carrier aggregation reception.

Exemplary embodiments of a reconfigurable carrier-aggregation receiver and filter can be constructed with complex poles (providing sharp filtering) or real poles (one or two stage with modest filtering), and can be configured as a complex filer that can distinguish positive and negative frequencies.

In an exemplary embodiment, the reconfigurable carrier-aggregation receiver and filter can form a complex filter using two filter instances, one for each carrier, and can be used to extract the carriers at the baseband using a single LO.

Figure 1:
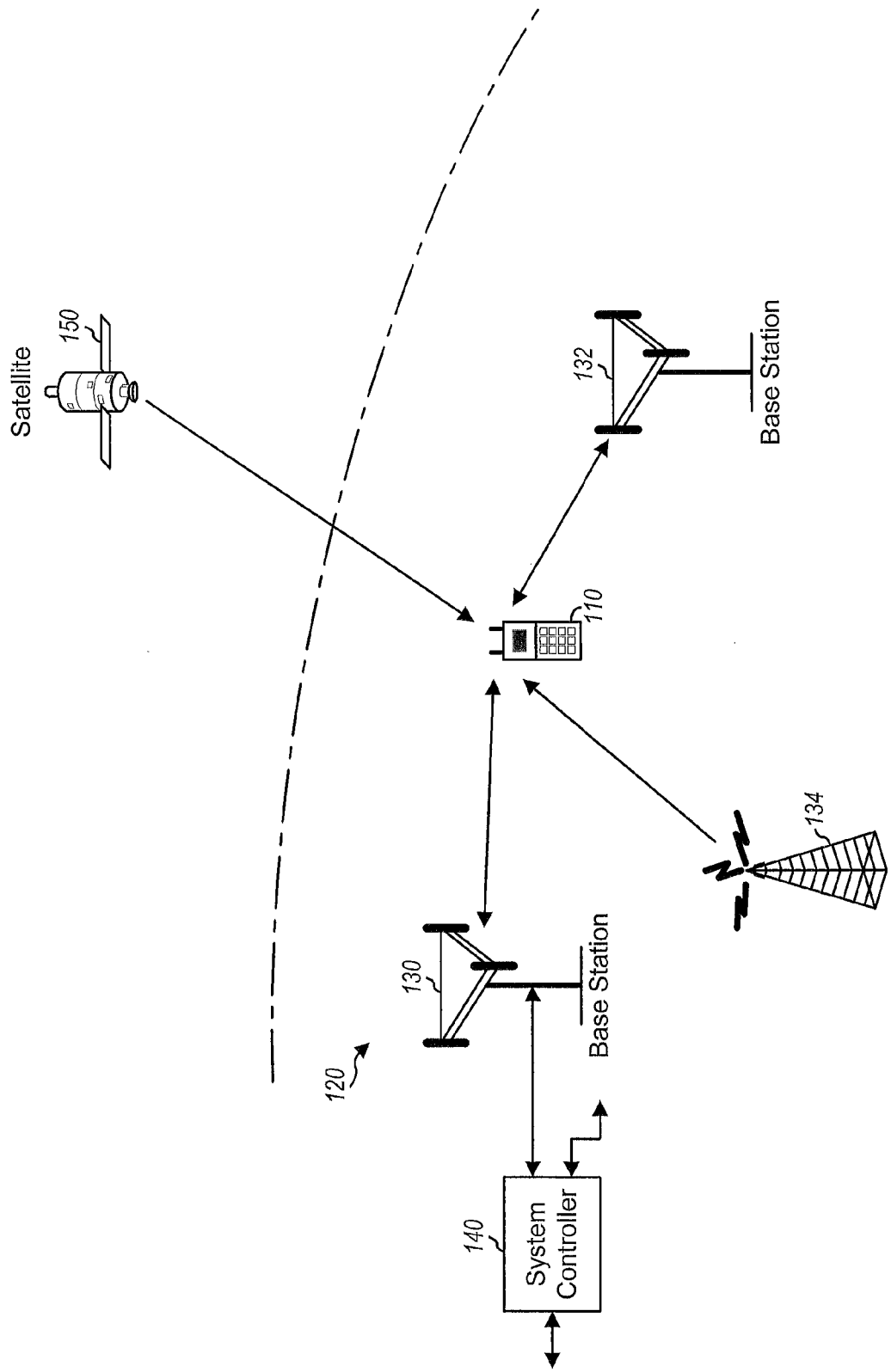
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), mid-band (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
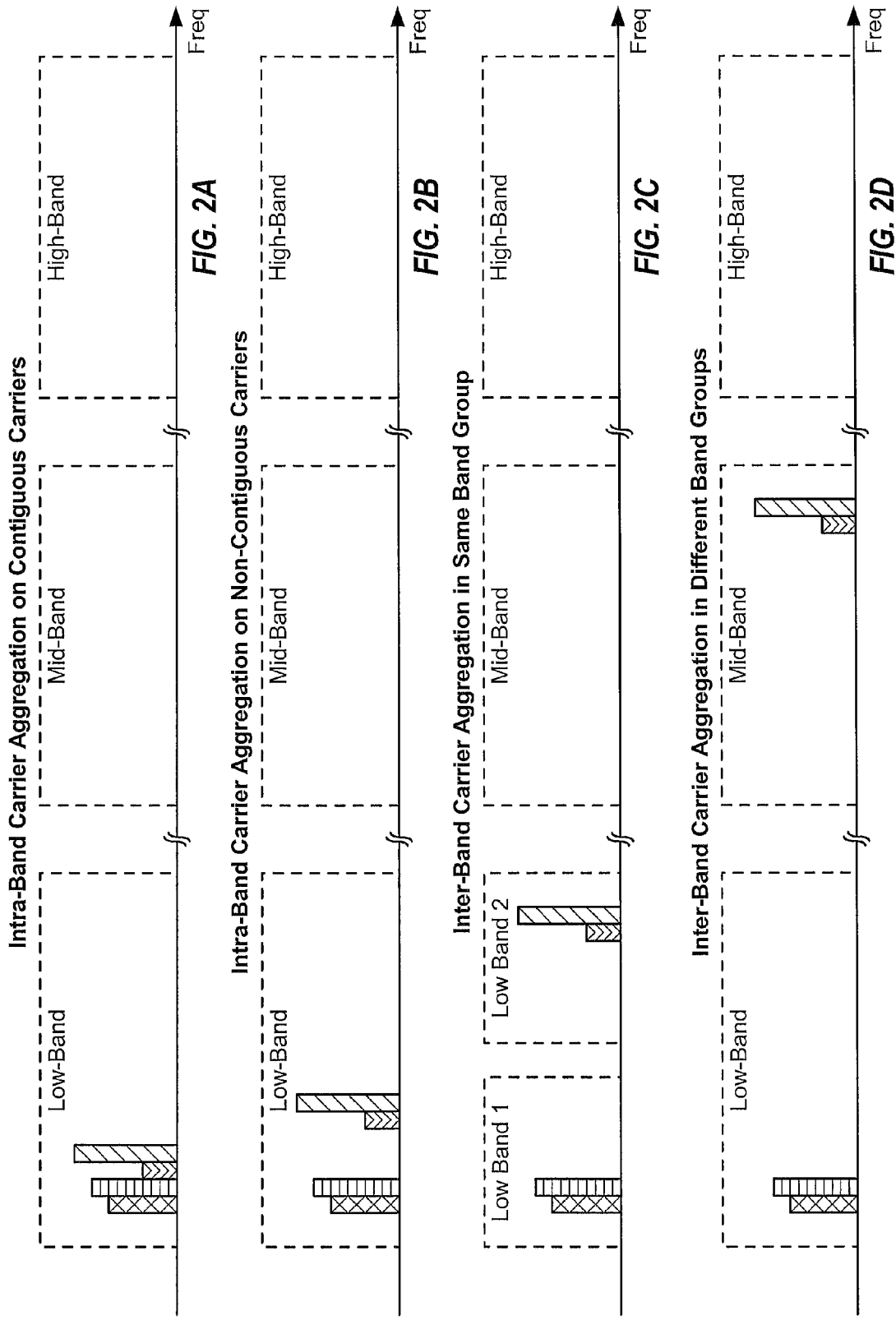
FIG. 2A is a graphical diagram showing an example of contiguous intra-band carrier-aggregation (CA).
FIG. 2B is a graphical diagram showing an example of non-contiguous intra-band CA.
FIG. 2C is a graphical diagram showing an example of inter-band CA in the same band group.
FIG. 2D is a graphical diagram showing an example of inter-band CA in different band groups.

FIG. 2A is a graphical diagram showing an example of contiguous intra-band carrier-aggregation (CA). In the example shown in FIG. 2A, wireless device 110 is configured with four contiguous carriers in one band in low-band. Wireless device 110 may send and/or receive transmissions on the four contiguous carriers within the same band.

FIG. 2B is a graphical diagram showing an example of non-contiguous intra-band CA. In the example shown in FIG. 2B, wireless device 110 is configured with four non-contiguous carriers in one band in low-band. The carriers may be separated by 5 MHz, 10 MHz, or some other amount. Wireless device 110 may send and/or receive transmissions on the four non-contiguous carriers within the same band.

FIG. 2C is a graphical diagram showing an example of inter-band CA in the same band group. In the example shown in FIG. 2C, wireless device 110 is configured with four carriers in two bands in low-band. Wireless device 110 may send and/or receive transmissions on the four carriers in different bands in the same band group.

FIG. 2D is a graphical diagram showing an example of inter-band CA in different band groups. In the example shown in FIG. 2D, wireless device 110 is configured with four carriers in two bands in different band groups, which include two carriers in one band in low-band and two carriers in another band in mid-band. Wireless device 110 may send and/or receive transmissions on the four carriers in different bands in different band groups.

FIGS. 2A to 2D show four examples of carrier aggregation. Carrier aggregation may also be supported for other combinations of bands and band groups.

Figure 3:
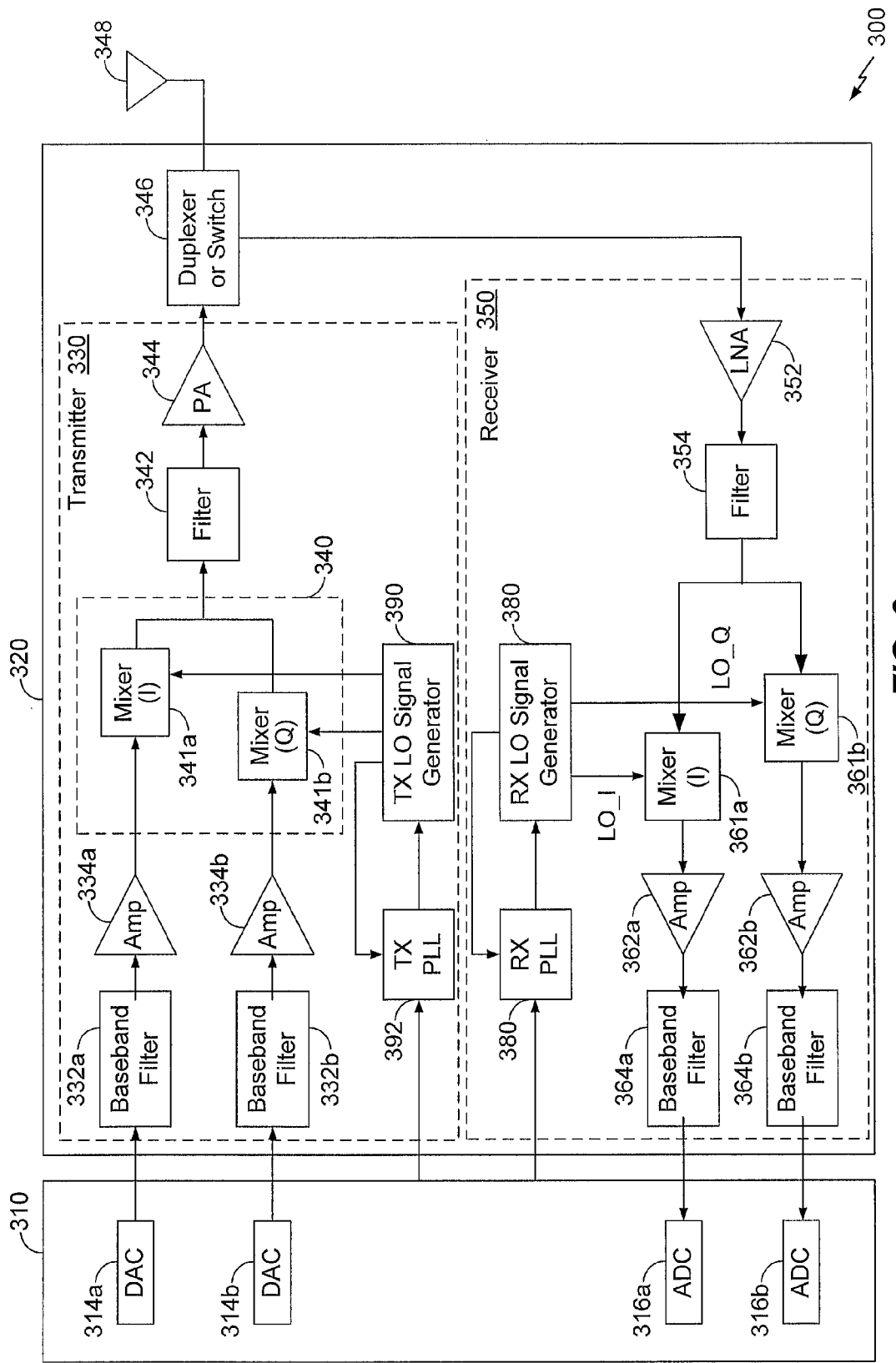
FIG. 3 is a block diagram of an exemplary design of wireless device in FIG. 1.

FIG. 3 is a block diagram showing a wireless communication device 300 in which the exemplary techniques of the present disclosure may be implemented. FIG. 3 shows an example of a transceiver 320. In general, the conditioning of the signals in a transmitter 330 and a receiver 350 may be performed by one or more stages of amplifier, filter, upconverter, downconverter, etc. These circuit blocks may be arranged differently from the configuration shown in FIG. 3. Furthermore, other circuit blocks not shown in FIG. 3 may also be used to condition the signals in the transmitter and receiver. Unless otherwise noted, any signal in FIG. 3, or any other figure in the drawings, may be either single-ended or differential. Some circuit blocks in FIG. 3 may also be omitted.

In the example shown in FIG. 3, wireless device 300 generally comprises a transceiver 320 and a data processor 310. The data processor 310 may include a memory (not shown) to store data and program codes, and may generally comprise analog and digital processing elements. The transceiver 320 includes a transmitter 330 and a receiver 350 that support bi-directional communication. In general, wireless device 300 may include any number of transmitters and/or receivers for any number of communication systems and frequency bands. All or a portion of the transceiver 320 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 3, transmitter 330 and receiver 350 are implemented with the direct-conversion architecture.

In the transmit path, the data processor 310 processes data to be transmitted and provides in-phase (I) and quadrature (Q) analog output signals to the transmitter 330. In an exemplary embodiment, the data processor 310 includes digital-to-analog-converters (DAC's) 314a and 314b for converting digital signals generated by the data processor 310 into the I and Q analog output signals, e.g., I and Q output currents, for further processing.

Within the transmitter 330, baseband filters 332a and 332b filter the I and Q analog transmit signals, respectively, to remove undesired images caused by the prior digital-to-analog conversion. The baseband filters 332a and 332b can be lowpass filters or bandpass filters, depending on the implementation. Amplifiers (Amp) 334a and 334b amplify the signals from baseband filters 332a and 332b, respectively, and provide I and Q baseband signals. An upconverter 340 upconverts the I and Q baseband signals with I and Q transmit (TX) local oscillator (LO) signals from a TX LO signal generator 390 and provides an upconverted signal. A filter 342 filters the upconverted signal to remove undesired images caused by the frequency upconversion as well as noise in a receive frequency band. A power amplifier (PA) 344 amplifies the signal from filter 342 to obtain the desired output power level and provides a transmit RF signal. The transmit RF signal is routed through a duplexer or switch 346 and transmitted via an antenna 348.

In the receive path, antenna 348 receives communication signals and provides a received RF signal, which is routed through duplexer or switch 346 and provided to a low noise amplifier (LNA) 352. The duplexer 346 is designed to operate with a specific RX-to-TX duplexer frequency separation, such that RX signals are isolated from TX signals. The received RF signal is amplified by LNA 352 and filtered by a filter 354 to obtain a desired RF input signal. Downconversion mixers 361a and 361b mix the output of filter 354 with I and Q receive (RX) LO signals (i.e., LO_I and LO_Q) from an RX LO signal generator 380 to generate I and Q baseband signals. The I and Q baseband signals are amplified by amplifiers 362a and 362b and further filtered by baseband filters 364a and 364b to obtain I and Q analog input signals, which are provided to data processor 310. The baseband filters 364a and 364b can be lowpass filters or bandpass filters, depending on the implementation. In the exemplary embodiment shown, the data processor 310 includes analog-to-digital-converters (ADC's) 316a and 316b for converting the analog input signals into digital signals to be further processed by the data processor 310.

In FIG. 3, TX LO signal generator 390 generates the I and Q TX LO signals used for frequency upconversion, while RX LO signal generator 380 generates the I and Q RX LO signals used for frequency downconversion. Each LO signal is a periodic signal with a particular fundamental frequency. A phase locked loop (PLL) 392 receives timing information from data processor 310 and generates a control signal used to adjust the frequency and/or phase of the TX LO signals from LO signal generator 390. Similarly, a PLL 382 receives timing information from data processor 310 and generates a control signal used to adjust the frequency and/or phase of the RX LO signals from LO signal generator 380.

Wireless device 300 may support CA and may (i) receive multiple downlink signals transmitted by one or more cells on multiple downlink carriers at different frequencies and/or (ii) transmit multiple uplink signals to one or more cells on multiple uplink carriers. In an exemplary embodiment, the wireless device 300 supports intra-carrier aggregation and can use a single LO signal to downconvert multiple intra-CA receive signals.

Figure 4:
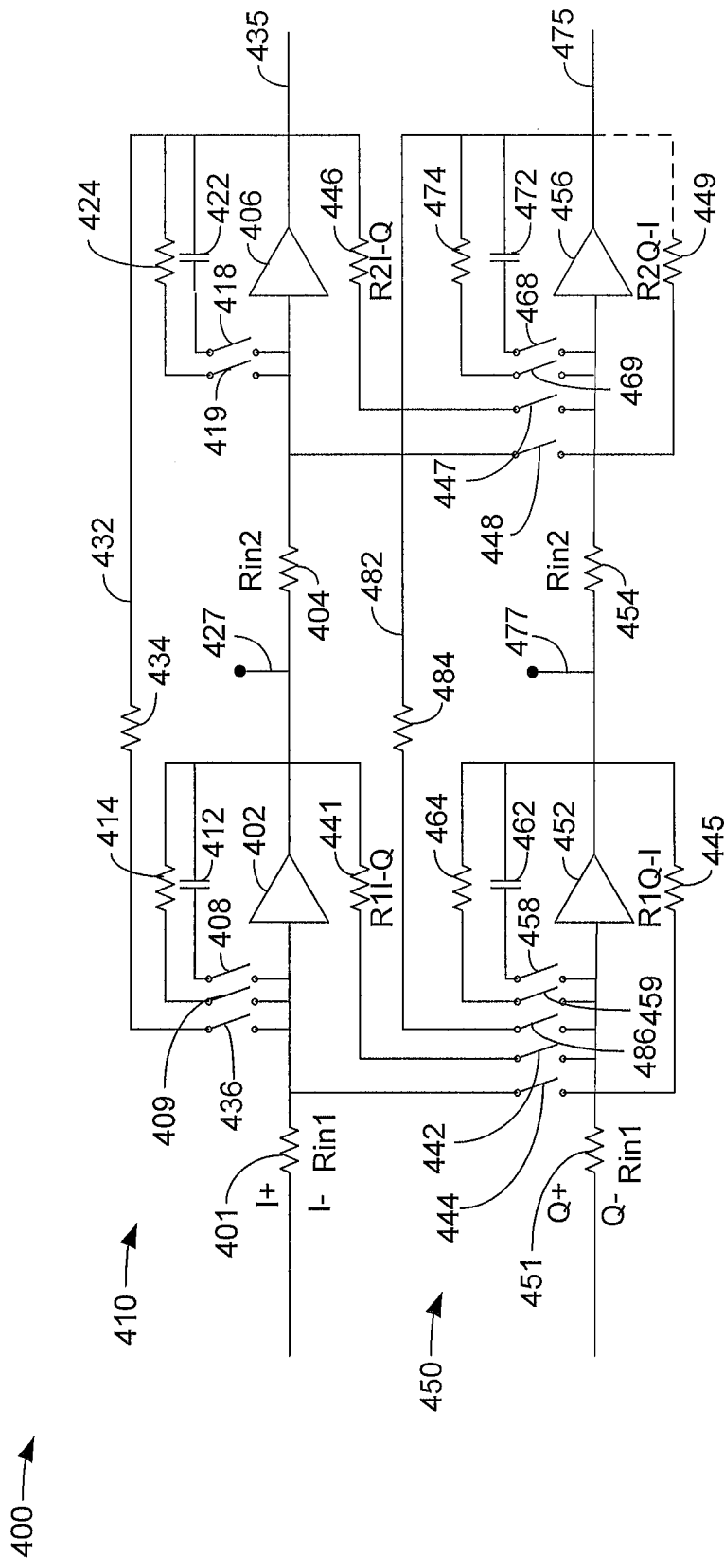
FIG. 4 is a schematic diagram illustrating an exemplary embodiment of a reconfigurable baseband filter that can be used in an intra-band carrier aggregation receiver to filter a received signal using a single local oscillator (LO) path.

FIG. 4 is a schematic diagram illustrating an exemplary embodiment of a reconfigurable baseband filter 400 that can be used in a reconfigurable intra-band carrier aggregation receiver to filter a received signal using a single local oscillator (LO) path. The baseband filter 400 is one exemplary embodiment of the baseband filter 364a and the baseband filter 364b shown in FIG. 3. In an exemplary embodiment the filter 400 is shown in a single-ended embodiment, but is configured to receive differential in-phase (I+, I−) and differential quadrature (Q+, Q−) components of a received signal provided by the low noise amplifier (LNA, FIG. 3), mixer 361a and 361b (FIG. 3) and the amplifiers 362a and 362b (FIG. 3). In an exemplary embodiment, the differential in-phase (I+, I−) components are processed by a first filter portion 410 and the differential quadrature (Q+, Q−) components are processed by a second filter portion 450.

The filter 400 can be configured to operate in multiple modes that can form multiple sub-filters. The multiple modes make use of different components in the filter 400. For example, with reference to the first filter portion 410, a first mode comprises using a first input resistance 401, a first in-phase (I) amplifier stage 402, a second input resistance 404 and a second I amplifier stage 406. In an exemplary embodiment, the first I amplifier stage 402 may comprise a transimpedance amplifier (TIA) stage and the second I amplifier stage 406 may comprise a pseudo-balanced amplifier (PBA) stage. However, other amplification technologies and architectures are possible. The first I amplifier stage 402 comprises a resistive/capacitive (RC) feedback network comprising a capacitance 412 connected between the input and the output of the first I amplifier stage 402 through a switch 408; and a resistance 414 connected between the input and the output of the first I amplifier stage 402 through a switch 409. The second I amplifier stage 406 comprises a resistive/capacitive (RC) feedback network comprising a capacitance 422 connected between the input and the output of the second I amplifier stage 406 through a switch 418; and a resistance 424 connected between the input and the output of the second I amplifier stage 406 through a switch 419. The switches 408, 409, 418 and 419 can be fabricated using any of a variety of transistor devices and technologies and can be controlled to be conductive or non-conductive using control logic (not shown).

With reference to the second filter portion 450, the first mode comprises using a first input resistance 451, a first quadrature (Q) amplifier stage 452, a second input resistance 454 and a second Q amplifier stage 456. In an exemplary embodiment, the first Q amplifier stage 452 may comprise a transimpedance amplifier (TIA) stage and the second amplifier stage 456 may comprise a pseudo-balanced amplifier (PBA) stage. However, other amplification technologies and architectures are possible. The first Q amplifier stage 452 comprises a resistive/capacitive (RC) feedback network comprising a capacitance 462 connected between the input and the output of the first Q amplifier stage 452 through a switch 458; and a resistance 464 connected between the input and the output of the first Q amplifier stage 452 through a switch 459.

The second Q amplifier stage 456 comprises a resistive/capacitive (RC) feedback network comprising a capacitance 472 connected between the input and the output of the second Q amplifier stage 456 through a switch 468; and a resistance 474 connected between the input and the output of the second Q amplifier stage 456 through a switch 469. The switches 458, 459, 468 and 469 can be fabricated using any of a variety of transistor devices and can be controlled to be conductive or non-conductive using control logic (not shown).

When the switches 408, 409, 458 and 459 are conductive, a one-stage filter with real poles can be constructed (with RC feedback around the first I amplifier stage 402 and the first Q amplifier stage 452. When the switches 408, 409, 418, 419, 458, 459, 468 and 469 are conductive, a two-stage filter with real poles can be constructed (with RC-feedback around the first I amplifier stage 402, first Q amplifier stage 452 and around the second I amplifier stage 406, and the second Q amplifier stage 456. A real filter having real poles provides modest filtering with reduced complexity.

As mentioned above, the filter 400 can be configured to operate in multiple modes. The multiple modes make use of different components in the filter 400. With continued reference to the first filter portion 410, a second mode adds a first negative feedback path 432 from the output of the second I amplifier 406, through a resistance 434 and through a switch 436 coupled between the resistance 434 and the input to the first I amplifier stage 402. In a differential application, the feedback path 432 provides negative feedback from the positive output of the second I amplifier stage 406 to the negative input of the first I amplifier stage 402 and from the negative output of the second I amplifier stage 406 to the positive input of the first I amplifier stage 402.

Similarly, with continued reference to the second filter portion 450, a second mode adds a second negative feedback path 482 from the output of the second Q amplifier stage 456, through a resistance 484 and through a switch 486 coupled between the resistance 484 and the input to the first Q amplifier stage 452. In a differential application, the feedback path 482 provides negative feedback from the positive output of the second Q amplifier stage 456 to the negative input of the first Q amplifier stage 452 and from the negative output of the second Q amplifier stage 456 to the positive input of the first Q amplifier stage 452. The switches 436 and 486 can be fabricated using any of a variety of transistor devices and can be controlled to be conductive or non-conductive using control logic (not shown).

When the switches 436 and 486 are conductive, along with the switches 408, 409, 418, 419, 458, 459, 468 and 469 being conductive, a real filter with complex poles can be constructed (including RC feedback around first I amplifier stage 402 and first Q amplifier stage 452; and second I amplifier stage 406 and second Q amplifier stage 456, with overall negative feedback through the first negative feedback path 432 and the second negative feedback path 482. In this exemplary embodiment, the low pass filter outputs are taken from the output of the second I amplifier stage 406 on connection 435 and from the output of the second Q amplifier stage 456 on connection 475. This filter mode offers sharp filtering at the expense of increased complexity.

A third mode couples the first filter portion 410 to the second filter portion 450. An output of the first I amplifier stage 402 is coupled through a resistance 441 to an input of the first Q amplifier stage 452 through a switch 442. An output of the first Q amplifier stage 452 is coupled through a resistance 445 to the input of the first I amplifier stage 402 through a switch 444. This allows the first I amplifier stage 402 to also operate on the Q output of the first Q amplifier stage 452; and allows the first Q amplifier stage 452 to operate on the I output of the first I amplifier stage 402.

An output of the second I amplifier stage 406 is coupled through a resistance 446 to an input of the second Q amplifier stage 456 through a switch 447. An output of the second Q amplifier stage 456 is coupled through a resistance 449 to the input of the second I amplifier stage 406 through a switch 448. This allows the second I amplifier stage 406 to also operate on the Q output of the second Q amplifier stage 456; and allows the second Q amplifier stage 456 to operate on the I output of the second I amplifier stage 406. The switches 442, 444, 447 and 448 can be fabricated using any of a variety of transistor devices and technologies and can be controlled to be conductive or non-conductive using control logic (not shown).

When the switches 442, 444, 447 and 448 are conductive, (along with the switches 408, 409, 418, 419, 458, 459, 468 and 469 being conductive, and with the switches 436 and 486 being non-conductive), a complex bandpass filter can be constructed. The bandpass filter outputs are taken from the output of the first I amplifier stage 402 on connection 427 and from the output of the first Q amplifier stage 452 on connection 477. This filter offers filtering of positive or negative frequencies (depending on the I/Q arrangement) with modest image rejection.

Figure 5:
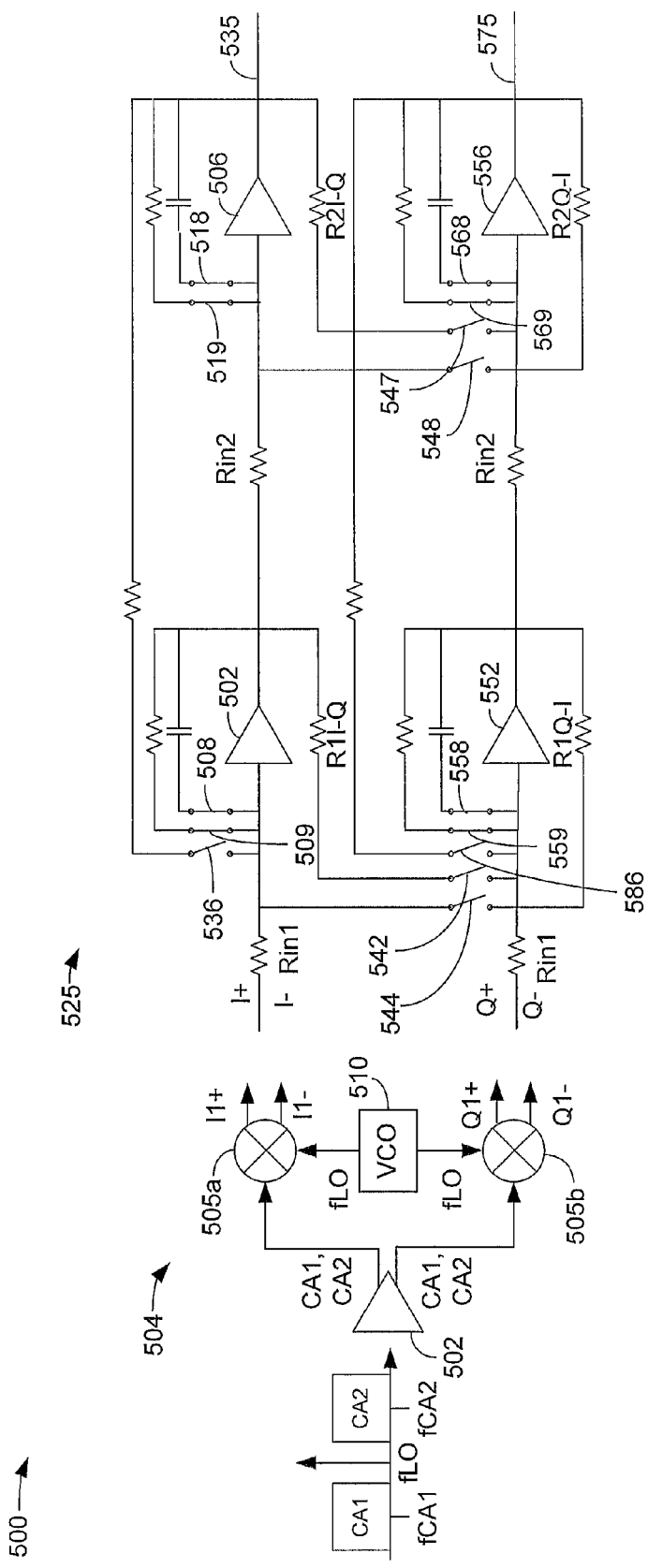
FIG. 5 is a schematic diagram illustrating an exemplary embodiment of a reconfigurable receiver and baseband filter configured as a low pass filter that can be used in an intra-band carrier aggregation receiver to filter a received signal using a single local oscillator (LO) path, in which a single receive chain processes the receive signal.

FIG. 5 is a schematic diagram illustrating an exemplary embodiment of a reconfigurable receiver and baseband filter configured as a low pass filter that can be used in an intra-band carrier aggregation receiver to filter a received signal using a single local oscillator (LO) path, in which a single receive chain processes the receive signal. The receiver 500 comprises a low noise amplifier (LNA) 502 configured to receive two non-contiguous carriers CA1 and CA2, and provide the carriers CA1 and CA2 to a mixer 504. The mixer 504 comprises an in-phase (I) mixer 505*a* and a quadrature (Q) mixer 505*b*. The mixer 504 receives a single local oscillator (LO) signal generated by a receive LO signal generator (referred to as a voltage controlled oscillator (VCO) 510. The VCO 510 includes a phase locked loop (PLL) (not shown for simplicity).

The baseband filter 525 comprises a first I amplifier stage 502, a second I amplifier stage 506, a first Q amplifier stage 552 and a second Q amplifier stage 556. Only the state of the switches for the baseband filter 525 will be described in detail because the active and passive elements of the filter 525 are identical to the active and passive elements of the baseband filter 400 described in FIG. 4. Reference numerals for the passive resistances and capacitances have been omitted for ease of illustration. In an exemplary embodiment, the baseband filter 525 can be configured as a real filter having real poles. In a situation where interfering signals (also referred to as "jammers") between carriers are small, in that the interfering signal is at an amplitude, or power, lower than the amplitude, or power, of the non-contiguous carriers CA1 and CA2, a real low pass filter having real poles is likely sufficient to downconvert the non-contiguous carriers CA1 and CA2. When the switches 508, 509, 518, 519, 558, 559, 568 and 569 associated with the first mode are conductive; and when the switches 536 and 586 associated with the second mode are non-conductive; and the switches 542, 544, 547 and 548 associated with the third mode are non-conductive, a real filter with real poles can be constructed.

In this exemplary embodiment, a single LO frequency can be used to downconvert the two non-contiguous carriers CA1 and CA2. A single LNA 502 and mixer 504 are used because the interfering signals between the non-contiguous carriers CA1 and CA2 are assumed to be small relative to the carriers CA1 and CA1. A single LO (generating a single fLO) located at a frequency substantially halfway between the respective frequencies the two carriers CA1 (fCA1) and CA2 (fCA2) can be used to downconvert both carriers, one to a positive frequency and the other to a negative frequency. In this exemplary embodiment, complex filtering is not needed in the analog domain due to the presence of a small interfering signal, thus allowing the carriers to be extracted in the digital domain. The low pass filter outputs are taken from the output of the second I amplifier stage 506 on connection 535 and from the output of the second Q amplifier stage 556 on connection 575.

Figure 6:
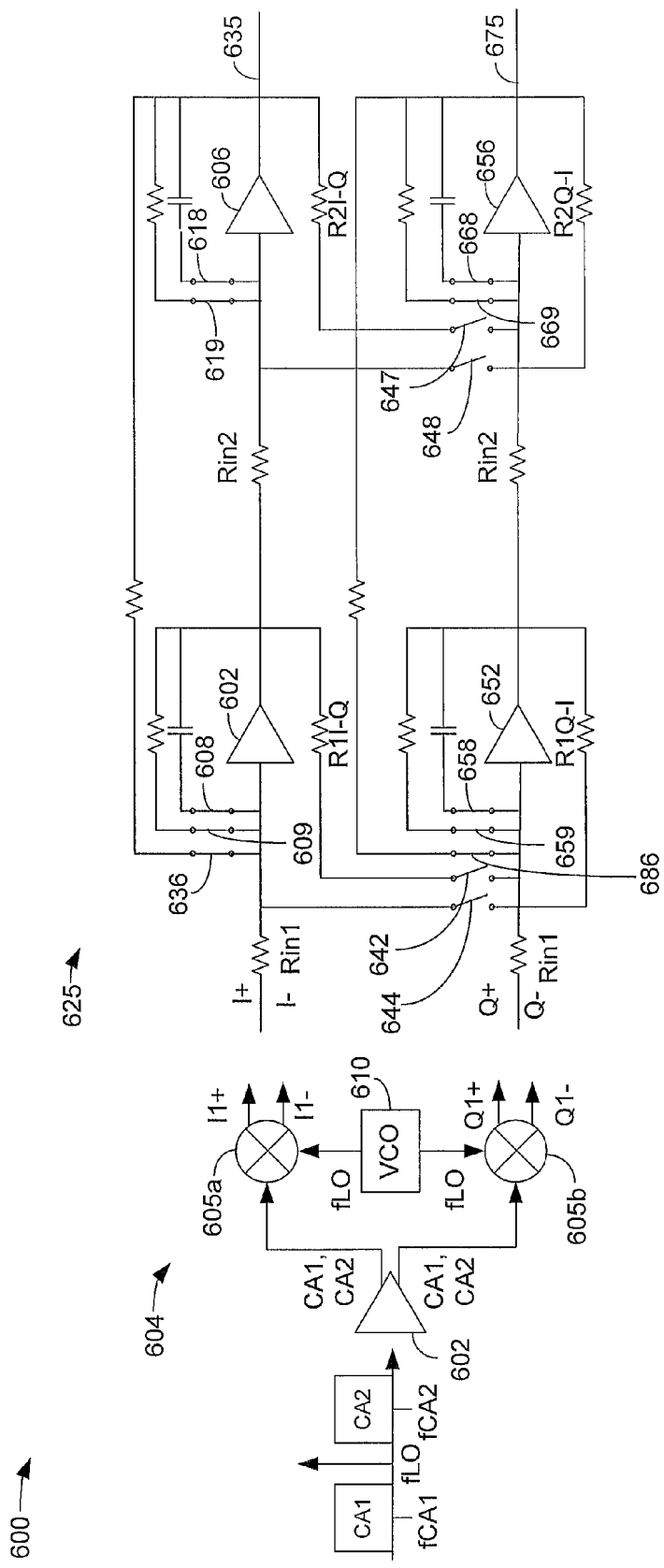
FIG. 6 is a schematic diagram illustrating another exemplary embodiment of a reconfigurable receiver and baseband filter configured as a low pass filter that can be used in an intra-band carrier aggregation receiver to filter a received signal using a single local oscillator (LO) path, in which a single receive chain processes the receive signal.

FIG. 6 is a schematic diagram illustrating another exemplary embodiment of a reconfigurable receiver and baseband filter configured as a low pass filter that can be used in an intra-band carrier aggregation receiver to filter a received signal using a single local oscillator (LO) path, in which a single receive chain processes the receive signal. The receiver 600 comprises a low noise amplifier (LNA) 602 configured to receive two non-contiguous carriers CA1 and CA2, and provide the carriers CA1 and CA2 to a mixer 604. The mixer 604 comprises an in-phase (I) mixer 605a and a quadrature (Q) mixer 605b. The mixer 604 receives a single local oscillator (LO) signal generated by a receive LO signal generator (referred to as a voltage controlled oscillator (VCO) 610. The VCO 610 includes a phase locked loop (PLL) (not shown for simplicity).

The baseband filter 625 comprises a first I amplifier stage 602, a second I amplifier stage 606, a first Q amplifier stage 652 and a second Q amplifier stage 656. Only the state of the switches for the baseband filter 625 will be described because the active and passive elements of the filter 625 are identical to the active and passive elements of the baseband filter 400 described in FIG. 4. Reference numerals for the passive resistances and capacitances have been omitted for ease of illustration. In an exemplary embodiment, the baseband filter 625 can be configured as a real filter having real and/or complex poles. In a situation where interfering signals (also referred to as "jammers") located between the carriers CA1 and CA2 are relatively small, in that the interfering signal is at an amplitude, or power, lower than the amplitude, or power, of the non-contiguous carriers CA1 and CA2, but an interfering signal located outside of the band in which the carriers CA1 and CA2 are located is higher in amplitude, or power, than the carriers, CA1 and CA2, the first and second modes described above can be activated to create a real low pass filter with real and/or complex poles. Complex filtering is particularly desirable when interfering signals are higher in amplitude than the carriers CA1 and CA2 and when the interfering signals are located outside of the frequency band in which the carriers are located. When the switches 608, 609, 618, 619, 658, 659, 668 and 669 associated with the first mode are conductive; and when the switches 636 and 686 associated with the second mode are conductive (and the switches 642, 644, 647 and 648 associated with the third mode are non-conductive), a real filter with real and/or complex poles can be constructed.

In this exemplary embodiment, a single LO frequency can be used to downconvert the two non-contiguous carriers CA1 and CA2. A single LNA 602 and mixer 604 are used because the interfering signals located between the non-contiguous carriers CA1 and CA2 are relatively small. A single LO (generating a single fLO) located at a frequency that is substantially halfway between the respective frequencies the two carriers CA1 (fCA1) and CA2 (fCA2) can be used to downconvert both carriers, one to a positive frequency and the other to a negative frequency. The low pass filter outputs are taken from the output of the second I amplifier stage 606 on connection 635 and from the output of the second Q amplifier stage 656 on connection 675. In this exemplary embodiment, complex filtering is not needed in the analog domain due to the presence of a small interfering signal between the carriers CA1 and CA2, but complex poles are desired to create a sharp filter response to eliminate a large interfering signal located outside of the band or bands in which the carriers CA1 and CA2 are located, thus allowing the carriers to be extracted in the digital domain.

Figure 7:
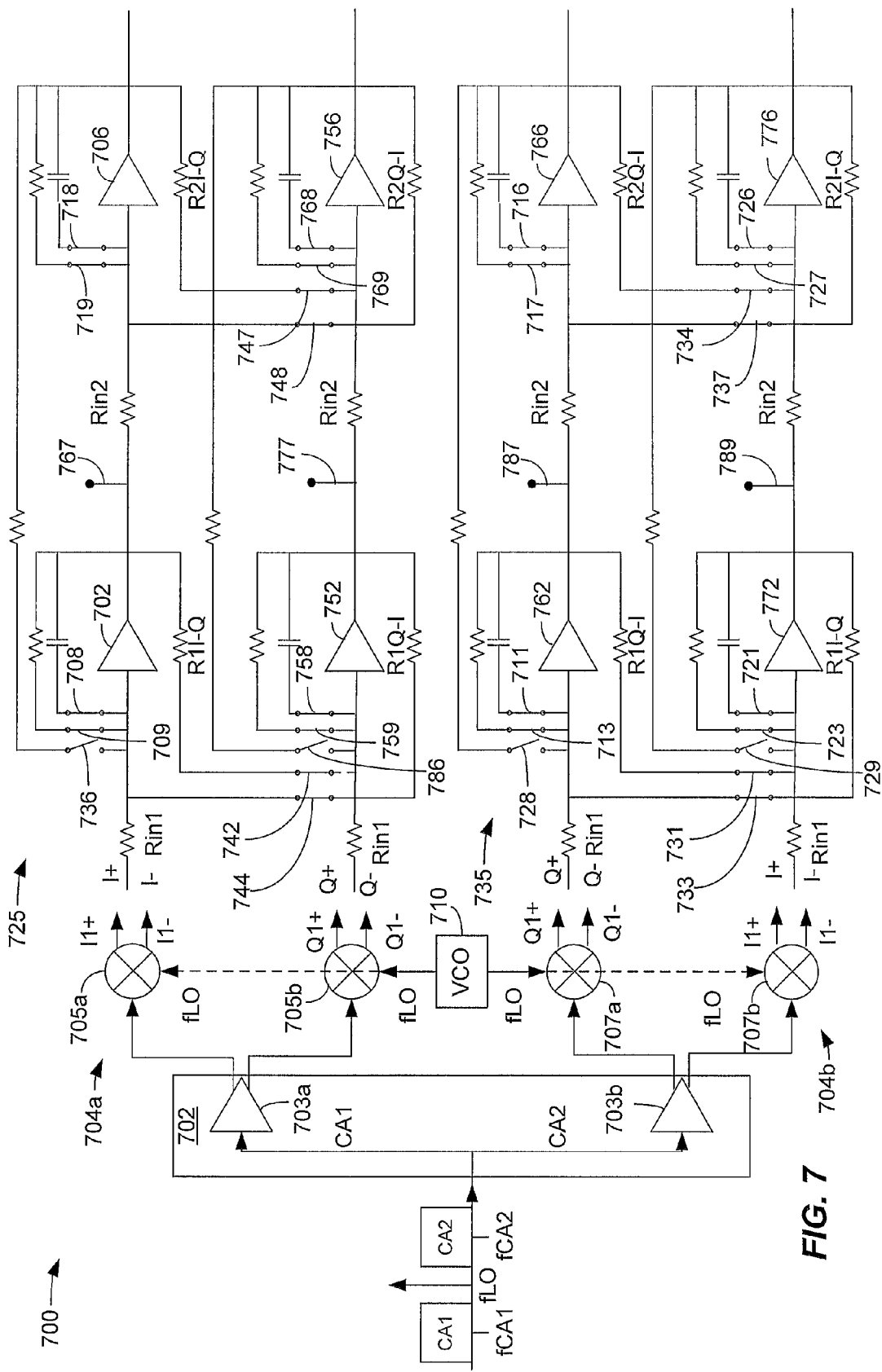
FIG. 7 is a schematic diagram illustrating an exemplary embodiment of a reconfigurable receiver and baseband filter that can be used in an intra-band carrier aggregation receiver to filter a received signal using a single local oscillator (LO) path, in which a single LNA provides the receive signal as two separate outputs to two separate receive chains.

FIG. 7 is a schematic diagram illustrating an exemplary embodiment of a reconfigurable baseband filter that can be used in an intra-band carrier aggregation receiver to filter a received signal using a single local oscillator (LO) path, in which a single LNA provides the receive signal as two separate outputs to two separate receive chains. The receiver 700 comprises a low noise amplifier (LNA) 702 configured to receive two non-contiguous carriers CA1 and CA2, and provide the carriers CA1 and CA2 as separate outputs via LNA portions 703a and 703b to a first mixer 704a and a second mixer 704b. The first mixer 704a comprises an in-phase (I) mixer 705a and a quadrature (Q) mixer 705b. The second mixer 704b comprises an in-phase (I) mixer 707a and a quadrature (Q) mixer 707b. The mixers 704a and 704b receive a single local oscillator (LO) signal generated by a receive LO signal generator (referred to as a voltage controlled oscillator (VCO) 710. The VCO 710 includes a phase locked loop (PLL) (not shown for simplicity).

The receiver 700 comprises two baseband filters, a first baseband filter 725 configured to process the I and Q components of the carrier CA1 and a second baseband filter 735 configured to process the I and Q components of the carrier CA2. The baseband filter 725 comprises a first I amplifier stage 702, a second I amplifier stage 706, a first Q amplifier stage 752 and a second Q amplifier stage 756. The baseband filter 735 comprises a first Q amplifier stage 762, a second Q amplifier stage 766, a first I amplifier stage 772 and a second I amplifier stage 776. Reference numerals for the passive resistances and capacitances have been omitted for ease of illustration. In an exemplary embodiment, the baseband filters 725 and 735 can be configured as a complex bandpass filter where the carriers CA1 and CA2 are divided by the LNA 702 and processed by two downconversion paths. Complex filtering is used to extract the information from the two carriers. For example, the first baseband filter 725 can extract the carrier CA1 to a positive frequency and the second baseband filter 735 can extract the carrier CA2 to a negative frequency. This positive and negative frequency processing can be achieved by swapping the filter's I and Q connection in the two baseband filters 725 and 735 (I/Q and Q/I filter feedback illustrated by the I output being directed to the Q input and the Q output being directed to the I input of the baseband filter 725 through switches 742, 744, 747 and 748 and the Q output being directed to the I input and the I output being directed to the Q input of the baseband filter 735 through switches 731, 733, 734 and 737). The positive and negative frequency extraction can also be performed in the LO path by swapping the I and Q connections in one of the quadrature mixers 704a or 704b.

When the switches 742, 744, 747 and 748 of the first bandpass filter 725 and the switches 731, 733, 734 and 737 of the second bandpass filter 735 associated with the third mode of operation are conductive, (together with the switches 708, 709, 718, 719, 758, 759, 768 and 769 of the first bandpass filter 725 and the switches 711, 713, 716, 717, 721, 723, 726 and 727 of the second bandpass filter 735 associated with the first mode being conductive and with the switches 736 and 786 of the first bandpass filter 725 and the switches 728 and 729 of the second bandpass filter 735 associated with the second mode being non-conductive, a complex bandpass filter can be constructed. In an exemplary embodiment, the bandpass filter outputs of the baseband filter 725 are taken from the output of the first I amplifier stage 702 on connection 767 and from the output of the first Q amplifier stage 752 on connection 777. The bandpass filter outputs of the baseband filter 735 are taken from the output of the first Q amplifier stage 762 on connection 787 and from the output of the first I amplifier stage 772 on connection 789.

Such a complex bandpass filter offers filtering of positive or negative frequencies (depending on the I/Q arrangement) with modest image rejection and is useful in situations in which the amplitude, or power, of the interfering signal between the carriers is significant, in that it may be higher than an amplitude, or power, of the first carrier CA1 or the second carrier CA2, and in which one of the carriers, CA1 or CA2, may be higher in amplitude, or power, than the other carrier. If one of the carriers CA1 or CA2 is higher in amplitude, or power, than the other, an image of the higher power carrier may corrupt the lower power carrier. In such an instance, increased image rejection is provided by the complex filters 725 and 735. A dual receive path, each having a mixer and PLL, with a single LO/VCO can be used to downconvert the two non-contiguous carriers with a single LO (fLO). In this exemplary embodiment, the two carriers are divided in the LNA 702 and are distributed to two downcoverting paths comprising the two quadrature mixers 704a and 704b and the two baseband filters 725 and 735.

A single LO (fLO) located at a frequency that is substantially halfway between the frequencies of the two carriers CA1 (fCA1) and CA2 (fCA2) can be used to downconvert both carriers, one to a positive frequency and the other to a negative frequency. In this exemplary embodiment, the filters 725 and 735 form a complex filter that is used to extract both carriers. In an exemplary embodiment, the first bandpass filter 725 can extract the first non-contiguous carrier CA1 and downconvert it to a positive frequency and the second bandpass filter 735 can extract the second non-contiguous carrier CA2 and downconvert it to a negative frequency.

The filters 725 and 735 provide positive and negative complex filtering, which is achieved by swapping the filter's I/Q connection in the two filters (I/Q vs. Q/I filter feedback) by operation of the switches 742, 744, 747, 748 and the switches 731, 733, 734 and 737. Although shown in FIG. 7 as the carrier CA1 being processed by the baseband filter 725 and the carrier CA2 being processed by the baseband filter 735, it is possible to swap the carriers CA1 and CA2 so that they are processed by the other baseband filter. Further, it is possible to delay the I or the Q signals through either of the baseband filter 725 or the baseband filter 735 to interchange the carriers CA1 and CA2 with respect to which is converted to a positive frequency and which is converted to a negative frequency.

Figure 8:
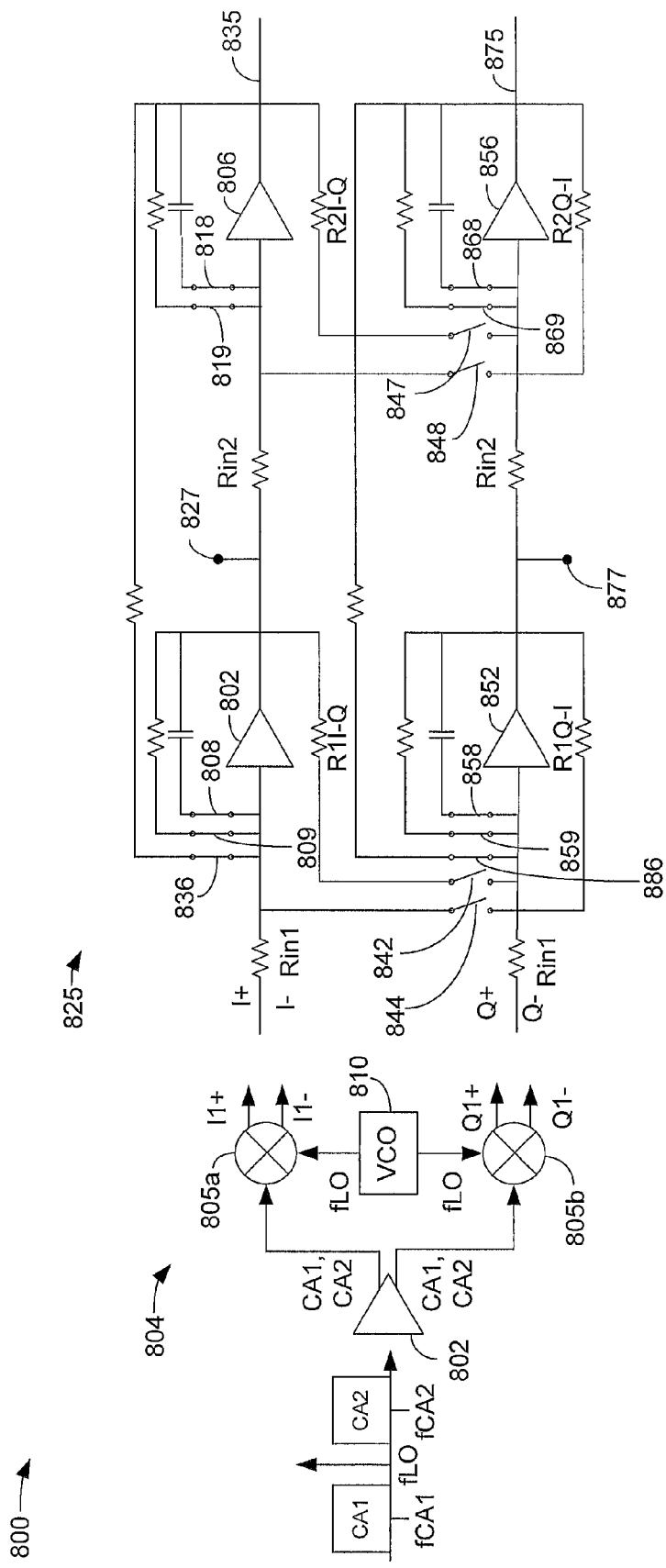
FIG. 8 is a schematic diagram illustrating another exemplary embodiment of a reconfigurable receiver and baseband filter configured as a bandpass filter that can be used in an intra-band carrier aggregation receiver to filter a received signal using a single local oscillator (LO) path, in which a single receive chain processes the receive signal.

FIG. 8 is a schematic diagram illustrating another exemplary embodiment of a reconfigurable receiver and baseband filter configured as a bandpass filter that can be used in an intra-band carrier aggregation receiver to filter a received signal using a single local oscillator (LO) path, in which a single receive chain processes the receive signal.

The receiver 800 comprises a low noise amplifier (LNA) 802 configured to receive two non-contiguous carriers CA1 and CA2, and provide the non-contiguous carriers CA1 and CA2 to a mixer 804. The mixer 804 comprises an in-phase (I) mixer 805a and a quadrature (Q) mixer 805b. The mixer 804 receives a single local oscillator (LO) signal generated by a receive LO signal generator (referred to as a voltage controlled oscillator (VCO) 810. The VCO 810 includes a phase locked loop (PLL) (not shown for simplicity). The baseband filter 825 comprises a first I amplifier stage 802, a second I amplifier stage 806, a first Q amplifier stage 852 and a second Q amplifier stage 856.

The baseband filter 825 is configured such that bandpass outputs are taken from the output of the first I amplifier stage 802 on connection 827 and the output of the first Q amplifier stage 852 on connection 877. Reference numerals for the passive resistances and capacitances have been omitted for ease of illustration. The baseband filter 825 can be configured as a real filter having real and/or complex poles. In a situation where interfering signals (also referred to as "jammers") between carriers are significant, in that they may have an amplitude, or power, that is higher than an amplitude, or power of the first carrier CA1 or the second carrier CA2, and in which the relative power of the carriers CA1 and CA2 is similar, the first and second modes described above can be activated to create a real bandpass filter. When the switches 808, 809, 818, 819, 858, 859, 868 and 869 associated with the first mode are conductive; and when the switches 836 and 886 associated with the second mode are conductive (and the switches 842, 844, 847 and 848 associated with the third mode are non-conductive), a real filter with real poles can be constructed.

In this exemplary embodiment, a single LO frequency can be used to downconvert the two non-contiguous carriers (CA1 and CA2). A single LO (generating a single fLO) located at a frequency that is substantially halfway between the respective frequencies the two carriers CA1 (fCA1) and CA2 (fCA2) can be used to downconvert both carriers, one to a positive frequency and the other to a negative frequency. In this exemplary embodiment, a bandpass filter allows the carriers CA1 and CA2 to be downconverted even if a relatively large interfering signal is located between the carriers CA1 and CA2.

To create a bandpass filter, it is desirable to have access to the I and Q signals at the output of the first I amplifier stage 802 and first Q amplifier stage 852. The output of the first I amplifier stage 802 on connection 827 and the first Q amplifier stage 852 on connection 877 is the real bandpass output of the baseband filter 825.

Figure 9:
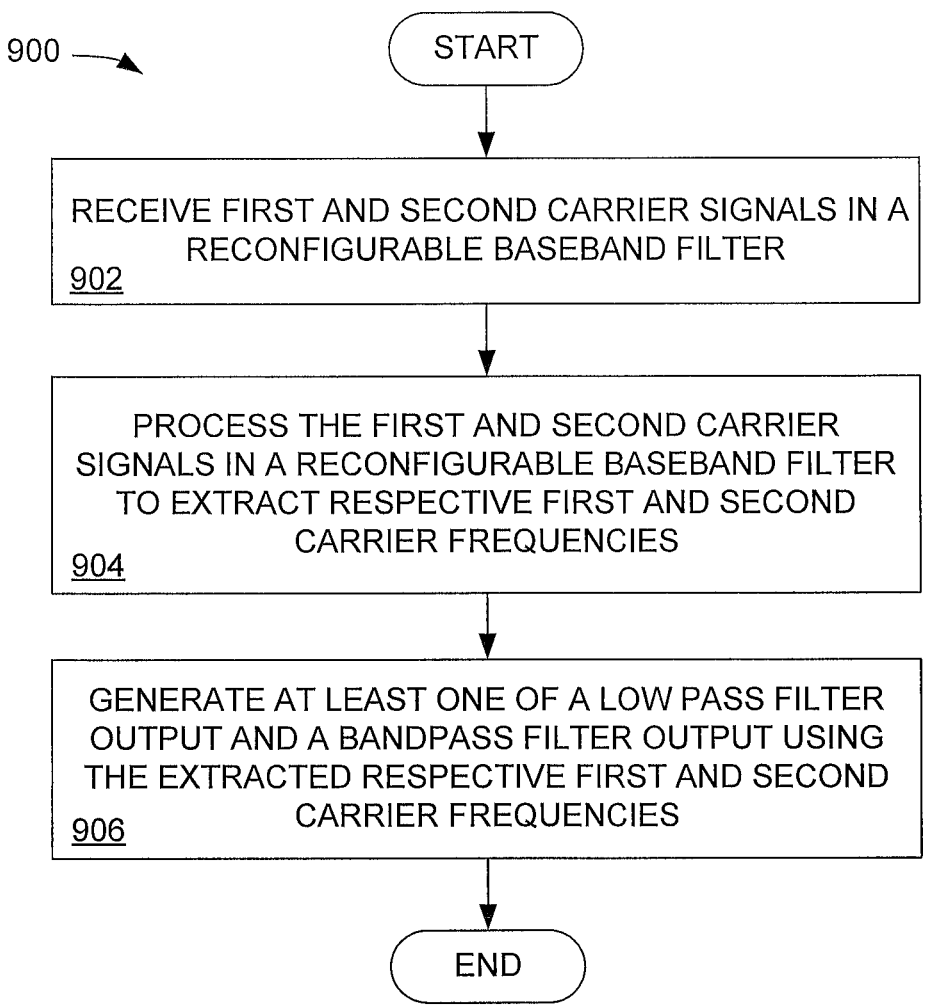
FIG. 9 is a flow chart describing the operation of an exemplary embodiment of a reconfigurable carrier-aggregation receiver and filter that can be used to process non-contiguous carriers.

FIG. 9 is a flow chart 900 describing the operation of an exemplary embodiment of a reconfigurable carrier-aggregation receiver and filter that can be used to process non-contiguous carriers. The blocks in the flow chart 900 can be performed in or out of the order shown, and in some embodiments, can be performed at least in part in parallel.

In block 902, a receiver having a reconfigurable baseband filter is configured to receive first and second carriers. In an exemplary embodiment, the first and second carriers can have non-contiguous frequencies.

In block 904, the first and second carriers are processed by the receiver and reconfigurable baseband filter to extract respective first and second carrier frequencies.

In block 906, at least one of a low pass filter output and a bandpass filter output are generated using the extracted respective first and second carrier frequencies.

The reconfigurable receiver and filter circuit described herein may be implemented on one or more ICs, analog ICs, RFICs, mixed-signal ICs, ASICs, printed circuit boards (PCBs), electronic devices, etc. The reconfigurable receiver and filter circuit may also be fabricated with various IC process technologies such as complementary metal oxide semiconductor (CMOS), N-channel MOS (NMOS), P-channel MOS (PMOS), bipolar junction transistor (BJT), bipolar- CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the receiver and filter circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
   a reconfigurable baseband filter configured to receive a communication signal having a first carrier and a second carrier, the reconfigurable baseband filter having a first filter portion and a second filter portion, the first filter portion and the second filter portion each comprising respective first and second amplification stages; and
   a plurality of switches associated with the first filter portion and the second filter portion, the plurality of switches for configuring the reconfigurable baseband filter into a plurality of sub-filters, each configured to generate at least one of a low pass filter output and a bandpass filter output.

2. The device of claim 1, wherein the reconfigurable baseband filter is configured as a real filter and is configured to provide switchable resistive/capacitive (RC) feedback to at least the first amplification stages.

3. The device of claim 1, wherein the reconfigurable baseband filter is configured as a real filter having real poles and complex poles and is configured to provide switchable resistive/capacitive (RC) feedback to the first and second amplification stages, and is configured to provide switchable resistive (R) feedback to a combination of the first and second amplification stages.

4. The device of claim 1, wherein the reconfigurable baseband filter is configured as a complex bandpass filter and is configured to provide switchable resistive/capacitive (RC) feedback to the first and second amplification stages, the reconfigurable baseband filter configured to filter both positive and negative frequencies.

5. The device of claim 1, wherein the reconfigurable baseband filter comprises a real bandpass filter and is configured to provide switchable resistive/capacitive (RC) feedback to the first and second amplification stages, and is configured to provide switchable resistive (R) feedback to a combination of the first and second amplification stages.

6. The device of claim 4, wherein the first carrier and the second carrier are processed by two instances of the reconfigurable baseband filter, a first reconfigurable baseband filter processes the first carrier and a second reconfigurable baseband filter processes the second carrier.

7. The device of claim 1, further comprising a single local oscillator (LO) for downconverting the first carrier and the second carrier, the single local oscillator (LO) signal having a frequency that is substantially halfway between a frequency of the first carrier and a frequency of the second carrier.

8. A method comprising:
   receiving a communication signal having a first carrier and a second carrier;
   processing the first and second carriers to extract first and second carrier frequencies;
   generating at least one of a low pass filter output and a bandpass filter output using the extracted first and second carrier frequencies; and
   processing the communication signal and an interfering signal having an amplitude lower than an amplitude of the first carrier and the second carrier.

9. The method of claim 8, further comprising:
   processing the communication signal and a first interfering signal located between the first carrier and the second carrier and having an amplitude lower than an amplitude of any of the first carrier and the second carrier; and processing the communication signal and a second interfering signal located outside of a band having the first carrier and the second carrier and having an amplitude higher than an amplitude of the first carrier and the second carrier.

10. The method of claim 8, further comprising processing the communication signal and an interfering signal located between the first carrier and the second carrier and having an amplitude higher than an amplitude of any of the first carrier and the second carrier, the first carrier having an amplitude different than an amplitude of the second carrier.

11. The method of claim 10, further comprising separately processing the first carrier and the second carrier.

12. The method of claim 8, further comprising processing the communication signal and an interfering signal located between the first carrier and the second carrier and having an amplitude higher than an amplitude of any of the first carrier and the second carrier, the first carrier having an amplitude substantially similar to an amplitude of the second carrier.

13. The method of claim 8, further comprising downconverting the first carrier and the second carrier using a single local oscillator (LO), the single local oscillator (LO) signal having a frequency that is substantially halfway between a frequency of the first carrier and a frequency of the second carrier.

14. A device, comprising:
   means for receiving a communication signal having a first carrier and a second carrier;
   means for processing the first and second carriers to extract first and second carrier frequencies;
   means for generating at least one of a low pass filter output and a bandpass filter output using the extracted first and second carrier frequencies; and
   means for processing the communication signal and an interfering signal having an amplitude lower than an amplitude of the first carrier and the second carrier.

15. The device of claim 14, further comprising:
   means for processing the communication signal and a first interfering signal located between the first carrier and the second carrier and having an amplitude lower than an amplitude of any of the first carrier and the second carrier; and
   means for processing the communication signal and a second interfering signal located outside of a band having the first carrier and the second carrier and having an amplitude higher than an amplitude of the first carrier and the second carrier.

16. The device of claim 14, further comprising means for processing the communication signal and an interfering signal located between the first carrier and the second carrier and having an amplitude higher than an amplitude of any of the first carrier and the second carrier, the first carrier having an amplitude different than an amplitude of the second carrier.

17. The device of claim 14, further comprising means for processing the communication signal and an interfering signal located between the first carrier and the second carrier and having an amplitude higher than an amplitude of any of the first carrier and the second carrier, the first carrier having an amplitude substantially similar to an amplitude of the second carrier.

18. The device of claim 14, further comprising means for downconverting the first carrier and the second carrier using a single local oscillator (LO), the single local oscillator (LO) signal having a frequency that is substantially halfway between a frequency of the first carrier and a frequency of the second carrier.

* * * * *